(12) United States Patent
Chou et al.

(10) Patent No.: US 7,082,069 B2
(45) Date of Patent: Jul. 25, 2006

(54) MEMORY ARRAY WITH FAST BIT LINE PRECHARGE

(75) Inventors: Sheree Chou, Taipei (TW); Lung-Feng Lin, Dasi Township (TW); Yu-Shen Lin, Taipei (TW)

(73) Assignee: Macronix International Co., LTD., Hsinchu (TW)

( * ) Notice: Subject to any disclaimer, the term of this patent is extended or adjusted under 35 U.S.C. 154(b) by 32 days.

(21) Appl. No.: 11/004,148

(22) Filed: Dec. 3, 2004

(65) Prior Publication Data

US 2006/0120175 A1 Jun. 8, 2006

(51) Int. Cl.
*G11C 7/00* (2006.01)
*G11C 16/06* (2006.01)

(52) U.S. Cl. .............. 365/203; 365/189.06; 365/185.2; 365/185.21; 365/185.25

(58) Field of Classification Search ................ 365/203, 365/189.06, 185.2, 185.21, 185.25
See application file for complete search history.

(56) References Cited

U.S. PATENT DOCUMENTS

| | | | |
|---|---|---|---|
| 5,463,586 A | 10/1995 | Chao et al. | |
| 6,219,290 B1 | 4/2001 | Chang et al. | |
| 6,327,184 B1 * | 12/2001 | Micheloni et al. | ....... 365/185.2 |
| 6,392,447 B1 | 5/2002 | Rai et al. | |
| 6,421,275 B1 | 7/2002 | Chen et al. | |
| 6,445,616 B1 * | 9/2002 | Kim | ....................... 365/185.2 |
| 6,449,190 B1 | 9/2002 | Bill | |
| 6,459,620 B1 | 10/2002 | Eshel | |
| 6,498,751 B1 | 12/2002 | Ordonez et al. | |

* cited by examiner

*Primary Examiner*—Hoai V. Ho
(74) *Attorney, Agent, or Firm*—Haynes Beffel & Wolfeld LLP; Mark A. Haynes

(57) ABSTRACT

An integrated circuit memory array with an extra column of memory cells and a reference bit line is provided, in which the reference bit line acts as a reference for a shared precharging and clamping control on the bit lines in the array. Precharge transistors are coupled to respective bit lines in the array, and adapted to precharge voltage on the respective bit lines to near a target level. A detector has an input coupled to the reference bit line and an output coupled to the precharge transistors on the plurality of bit lines. The detector generates a precharge signal which turns off the precharge transistors when the reference bit line has a voltage near the target level, and turns on the precharge transistors when the reference bit line has a voltage below the target level.

22 Claims, 5 Drawing Sheets

MEMORY ARRAY WITH FAST BIT LINE PRECHARGE

BACKGROUND OF THE INVENTION

1. Field of the Invention

The present invention relates to integrated circuit memory devices, and to sense circuitry in such memory devices.

2. Description of Related Art

Integrated circuit memory devices are becoming smaller and faster. One limitation on the size and speed of memory devices arises from circuitry used for precharging and biasing bit lines in preparation for sensing data from the array. Typical structures used for these purposes are illustrated in U.S. Pat. No. 6,219,290, entitled MEMORY CELL SENSE AMPLIFIER, invented by Chang et al.; U.S. Pat. No. 6,498,751, entitled FAST SENSE AMPLIFIER FOR NON-VOLATILE MEMORIES, invented by Ordonez, et al.; and U.S. Pat. No. 6,392,447, entitled SENSE AMPLIFIER WITH IMPROVED SENSITIVITY, invented by Rai et al.

FIG. 1 illustrates a basic biasing structure used in prior art memory devices. The memory devices include a plurality of sense amplifiers, such as sense amplifiers 22, 23, 24 and 25. In the illustrated system, sense amplifier 22 has a first input coupled to bit line BL0 and a second input coupled to a reference voltage on line 26. Sense amplifier 23 has a first input coupled to bit line BL1 and a second input coupled to a reference voltage on line 27. Sense amplifier 24 has a first input coupled to bit line BL2 and a second input coupled to a reference voltage on line 28. Sense amplifier 25 has a first input coupled to bit line BL127 and a second input coupled to a reference voltage on line 29. As shown, a number of sense amplifiers, such as 8, 16, 32, 64, the illustrated 128, or more, for sensing a number of bits of data in parallel from a memory array are provided. Decoding circuitry, not shown, is used to select, from among thousands of columns of memory cells in a typical integrated circuit memory device, columns of memory cells for connection to the bit lines in response to addressing. In FIG. 1, memory cell 30 is shown coupled to bit line BL0, memory cell 31 is shown coupled to bit line BL1, memory cell 32 is shown coupled to bit line BL2 and memory cell 33 is shown coupled to bit line BL127. A capacitance $C_{BL}$ is illustrated in the figure, which represents the total bit line capacitance for a path on the bit line BL0 to a selected memory cell on a selected column in the memory array. The voltage on the bit line $V_{BL}$, is established by charging the bit line capacitance $C_{BL}$ with current through the load transistors 14–17.

Each of the bit lines BL0, BL1, BL2, . . . BL127 includes a biasing structure used to bias the bit line in preparation for sensing. The biasing structure in the illustrated embodiment for the bit line BL0 comprises a clamp transistor 10 and a load transistor 14. Clamp transistor 11 and load transistor 15 are coupled with bit line BL1. Clamp transistor 12 and load transistor 16 are coupled with bit line BL2. Clamp transistor 13 and load transistor 17 are coupled with bit line BL127. The load transistors 14–17 in the illustrated embodiment comprise respective n-channel MOS transistors having their gates and drains coupled to a supply potential VDD, and sources coupled to a sensing node (labeled $V_{CELL}$ at the sense amplifier inputs) on the respective bit lines. The clamp transistors 10–13 comprise respective n-channel MOS transistors having drains coupled to the sensing nodes ($V_{CELL}$), sources coupled to conductors that are coupled via decoding circuitry to the selected memory cells in the array, and gates coupled to the output of respective feedback inverters 18–21. The inputs to the feedback inverters 18–21 are coupled to the sources of the clamp transistors 10–13 and to the conductors that are coupled via decoding circuitry to the selected memory cells in the array.

In the operation, the load transistors and clamp transistors maintain the sensing node at a level designed to match the sense amplifier operation, and to allow fast sensing. Thus, the sensing node is maintained at a level usually just above the reference voltage (labeled $V_{REF}$ at the sense amplifier inputs). With reference to bit line BL0, as the voltage $V_{BL}$ on the bit line BL0 at the source of the clamp transistor 10 reaches a level at the trigger point of the feedback inverter 18, the output of the feedback inverter 18 starts to go down, and begins to turn off the clamp transistor 10, which reduces current flow and tends to allow the voltage on the source of the clamp transistor 10 to stop rising, or go down. An equilibrium condition is established on the bit line BL0 by this dynamic feedback, with a small current through the load transistor 14. The voltage at the sensing node $V_{CELL}$ settles at the target level, and the bit line is ready for sensing. After the interval allowing the voltage at the sensing node to settle at the target level, the memory cell is accessed for sensing by applying a word line potential to the gate of the memory cell, for example, on a selected word line. If the memory cell turns on in response to the voltage applied on its gate, then the voltage on the sensing node will be pulled down below the reference voltage $V_{REF}$. On the other hand, if the memory cell does not turn on in response to the voltage applied on its gate, then the voltage on the sensing node will not be pulled down. The sense amplifier determines how the voltage on the sensing node behaves and generates an output signal indicating the value of the data stored in the memory cell.

In an alternative embodiment known in the prior art, as shown in FIG. 2, the dynamic feedback inverters are replaced with a simple bias voltage $V_{BIAS}$. Thus, the embodiment shown in FIG. 2 includes load transistor 40 and clamp transistor 41, which are arranged like load transistor 14 and clamp transistor 10 of FIG. 1. The bias voltage $V_{BIAS}$ is produced by a reference voltage circuit, and applied to the gate of the clamp transistor 41. The source of the clamp transistor 41 is coupled to a selected memory cell through decoding circuitry not shown. The bit line capacitance is represented by the capacitor $C_{BL}$ as discussed above with respect to FIG. 1. The sensing node between the load transistor 40 and the clamp transistor 41 is coupled to a sense amplifier 42. The circuit in FIG. 2 operates in a manner similar to that described above with respect to FIG. 1, without the dynamic feedback. As the voltage $V_{BL}$ on the bit line reaches a level that is about a threshold voltage drop across the clamp transistor 41 below the bias voltage $V_{BIAS}$, the clamp transistor 41 begins to turn off and reduce current flow. The dynamic balance is achieved with the voltage at the sensing node $V_{CELL}$ settling on a target value. At this point, the precharge step is completed, and the bit line is ready for sensing. Upon accessing a memory cell, the cell data influences the voltage at the node $V_{CELL}$, causing it to move quickly toward a high cell threshold value $V_{CELL\_HVT}$ or toward a low cell threshold value $V_{CELL\_LVT}$. The reference voltage $V_{REF}$ applied to the sense amplifier 42 is set at a value about halfway between $V_{CELL\_HVT}$ and $V_{CELL\_LVT}$. The margin between the target value on $V_{CELL}$ and $V_{REF}$ at the sense amplifier 42 is large enough to cover noise effects, but as small as possible for quick sensing.

The time required for the voltage on the sensing node to settle at its target level has limited the speed of such sensing systems. Thus, precharging techniques have been provided such as shown in FIG. 3, which apply a higher current during the process of raising the bit line voltage $V_{BL}$ to establish the target level at the sensing node. In the prior art embodiment of FIG. 3, a bit line is coupled to a selected memory cell 53 by decoding circuitry not shown. The clamp transistor 51 on the bit line is connected to the sensing node $V_{CELL}$. A load 50 (such as the diode connected transistor shown in FIG. 1 and FIG. 2, but also other types of loads could be provided), is connected between the sensing node $V_{CELL}$ and a supply potential VDD. Sense amplifier 52 is coupled to the sensing node $V_{CELL}$ and a reference voltage $V_{REF}$, as described above. The gate of the clamp transistor 51 is connected to bias voltage $V_{BIAS}$ like that described with reference to FIG. 2. In an alternative system, a dynamic feedback inverter, connected as shown in FIG. 1, is used to bias the gate of the clamp transistor 51. Additional precharge current is provided through transistor 54 and transistor 55. Transistor 54 is an n-channel MOS transistor having its source coupled to the source of clamp transistor 51, and its gate coupled to the gate of clamp transistor 51 so that it receives the same bias voltage $V_{BIAS}$ (or the same output of the feedback inverter). Transistor 55 is a p-channel MOS transistor having its drain coupled to the drain of transistor 54, its source coupled to a precharge supply voltage, which is typically, although not necessarily, the same supply voltage as the load supply voltage VDD. The gate of the transistor 55 is controlled by a logic signal PRE, which enables precharging when it is at a low level, by turning on transistor 55 into saturation with consequently very little voltage drop across it. Transistor 54 is a transistor having a higher threshold voltage than the clamp transistor 51. The higher threshold is achieved for example by making transistor 54 with a narrower and longer channel region. Therefore, during a precharge interval precharge paths are provided both through the load 50 and the transistor 55. Both transistors 54 and 51 will be on while the voltage on the bit line $V_{BL}$ is low. As the voltage on the bit line $V_{BL}$ approaches $V_{BIAS}$ (less the threshold of transistor 54, including body effects), transistor 54 will turn off first because of its higher threshold voltage, and disable the precharge path through transistor 55. Dynamic balance will be achieved between the load 50 and the clamp transistor 51 as described above, settling the sensing node at the target level. Because the path through transistor 55 is enabled during the first part of the precharge operation, more current is applied to charging up the bit line capacitance $C_{BL}$, and the voltage on the bit line $V_{BL}$ rises more quickly. Thus, the sensing system settles on the target voltage more quickly. With a shorter precharge interval, faster sensing can be achieved.

While these prior art techniques have been applied for memory devices successfully, as memory access speeds increase, component sizes decrease, and more complicated and more highly parallel sensing structures are deployed, the requirement of complex biasing structures on every bit line is becoming a limiting factor on size and cost of integrated circuit memories. It is therefore desirable to provide sensing systems that occupy less space on an integrated circuit, operate faster and consume less power.

SUMMARY OF THE INVENTION

An integrated circuit memory device is described including an array of memory cells with an extra column of memory cells and a reference bit line coupled to the extra column, in which the reference bit line acts as a reference for a shared precharge control signal on the bit lines in the array. The memory device in an embodiment described herein includes an array of memory cells with a plurality of columns and rows. A plurality of bit lines is coupled to the columns in the array and a plurality of word lines is coupled to the rows in the array. The extra column of memory cells and the reference bit line are included on the device, as part of, or as a component adjacent to, the memory array. Clamp circuits are coupled to respective bit lines in the plurality of bit lines, and adapted to prevent voltage on the respective bit lines from exceeding a target level. Precharge circuits are also coupled to respective bit lines in the plurality of bit lines, and adapted to assist setting a voltage on the respective bit lines near the target level. A detector is provided that has an input coupled to the reference bit line and an output coupled to the precharge circuits on the plurality of bit lines, and operates to enable and disable the precharge circuits based on timing information from the reference bit line.

In a described embodiment, a reference clamp comparator is coupled to the reference bit line as well, and generates a bias voltage on its output which turns on the clamp circuits at a first bias level when the reference bit line has a voltage below the target level, and at a second bias level, which is lower than the first bias level, when the reference bit line has a voltage near the target level. In this manner, the clamp circuits receive higher voltage during the first part of the precharge cycle and conduct more current to increase the speed of precharging the bit line. As the voltage on the reference bit line nears the target level, the precharge detector generates the precharge control signal to turn off the precharge circuits on the plurality of bit lines, and the clamp comparator switches the bias voltage to a lower level, at which the clamp circuits are maintained in a clamping condition, and a dynamic balance is achieved to prepare the bit lines for sensing.

A disclosed embodiment includes a circuit which causes the detector to generate the precharge signal which turns off precharge transistors before the comparator switches from the higher first bias level to the lower second bias level. The circuit can be implemented as described herein using a parallel clamping transistor and load coupled to the reference bit line, where the parallel clamping transistor has a source coupled to the source of the reference clamping transistor on the reference bit line, a drain coupled through load to a load supply voltage, and a gate coupled to the output of the comparator. The input of the detector in this embodiment is coupled to the drain of the parallel clamping transistor, and the parallel clamping transistor has a threshold higher than said reference clamping transistor, causing it to switch off, and the voltage on its drain to rise, before the reference clamping transistor begins to clamp the node to ensure that the precharge transistors are turned off before the clamping transistors are switched to the lower bias level.

The reference bit line in an embodiment of the technology described herein is arranged to emulate the timing of the bit lines in the array by, for example, structurally matching the bit lines in the array, so that voltage changes during precharging on the reference bit line match those on the bit lines in the array that are being accessed for sensing. In an example, the extra column of memory cells to which the reference bit line is coupled includes the same number of memory cells as a column of memory cells in the array.

An embodiment is described which includes a reference precharge circuit on the reference bit line, a reference clamp circuit on the reference bit line, and a reference load on the reference bit line. The reference precharge circuit, the reference clamp circuit and the reference load are arranged to match corresponding precharge circuits, clamp circuits and loads on the bit lines in the array, so that voltages on the reference bit line during precharging through the reference precharge transistor and the reference clamp transistor, change at the essentially same rate of change as voltages on the bit lines in the array for the purpose of the timing of the precharging and clamping.

A sense amplifier suitable for use with the plurality of bit lines of the memory array, according to the embodiments described above, includes a dummy cell or an array of dummy cells which are arranged to emulate the voltage threshold behavior of memory cells in the array. The dummy cell is used to generate a reference voltage for the sense amplifier, which tracks changes in the threshold voltages of memory cells in the array that occur due to temperature changes and the like.

In general, a method for sensing data in a memory device is described, where the memory device comprises an array of memory cells including a plurality of columns and rows, a plurality of bit lines coupled to columns in the array and a plurality of word lines coupled to rows in the array. The method includes emulating the timing of bit lines in the plurality of bit lines with an extra column of memory cells and a reference bit line coupled to the extra column of memory cells. Nodes on respective bit lines in the plurality of bit lines are precharged to near a target level in response to a precharge signal generated based on the timing of the reference bit line. Also, nodes on the respective bit lines are clamped near a target level with clamp transistors that are responsive to a bias voltage. The bias voltage is generated based on timing on the reference bit line. In one embodiment, the bias voltage has a first bias level when the reference bit line has a voltage below the target level, and a second lower bias level when the reference bit line has a voltage near the target level. In an embodiment described herein, the precharge signal turning off the precharge transistors in the array is applied before the bias voltage on the clamp transistors is switched from the higher first bias level to the lower second bias level.

According to the technology described herein, an extra reference bit line is coupled with circuitry to generate a precharge control signal and clamping bias signal for a plurality of precharge circuits and clamping circuits in the array. A detector circuitry is consolidated on the reference bit line, instead of for example using a large number of dynamic feedback inverters, as described with reference to FIG. 1, which reduces current consumption in the sensing system and reduces layout area. Also, these advantages are provided along with fast precharging in embodiments of the disclosed technology, provided by automatically timed precharge signals and the dual bias voltages generated for the clamping circuits, where the first bias voltage is used for enabling higher current flow through the clamp transistors to improve the speed of precharging, and a second bias voltage is used for a clamping bias to establish a dynamic balance for sensing.

Other aspects and advantages of the present invention can be seen on review of the drawings, the detailed description and the claims, which follow.

DETAILED DESCRIPTION

Figure 1:
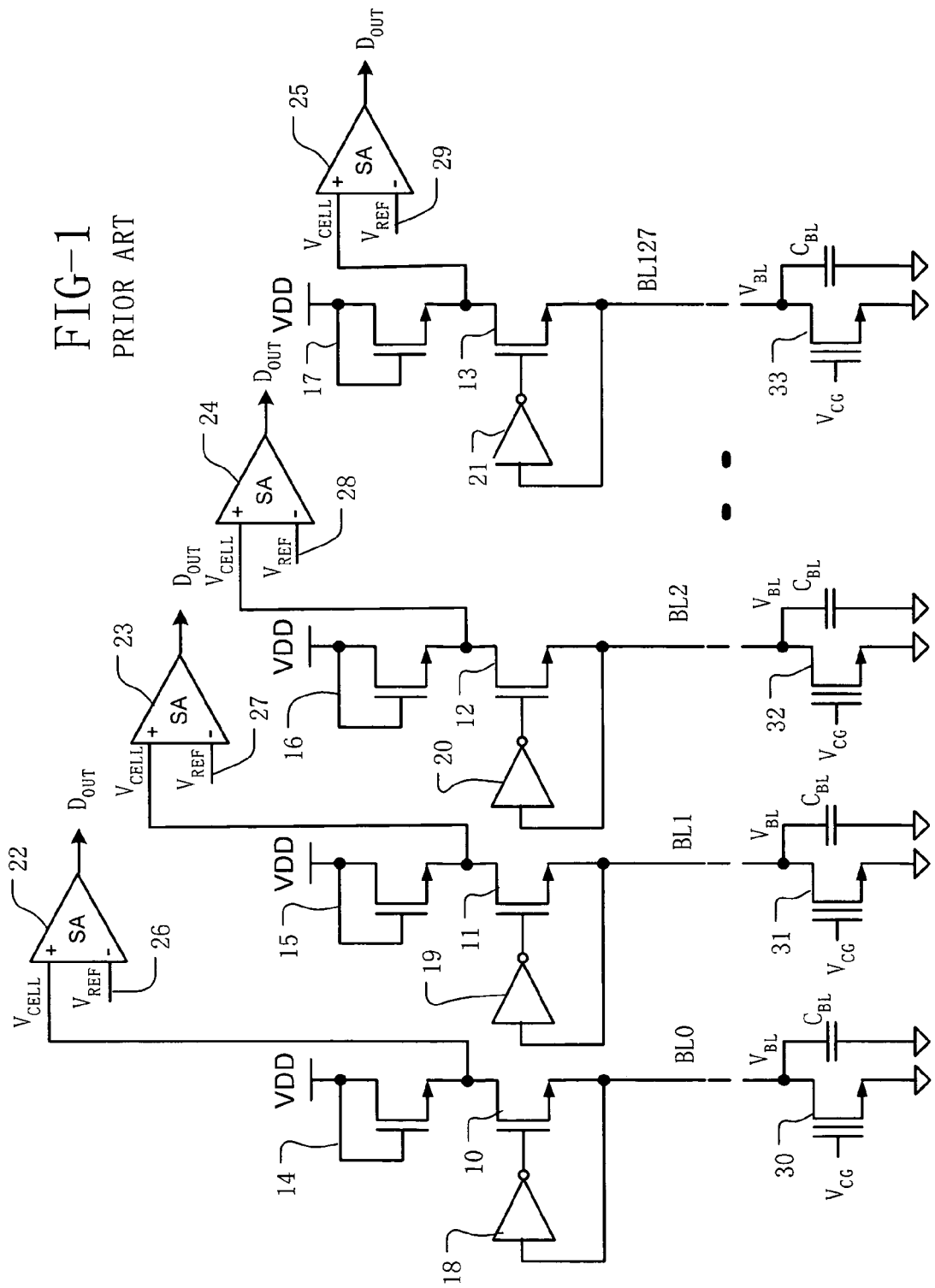
FIG. 1 illustrates a prior art sensing circuit based on dynamic inverter feedback.
Figure 2:
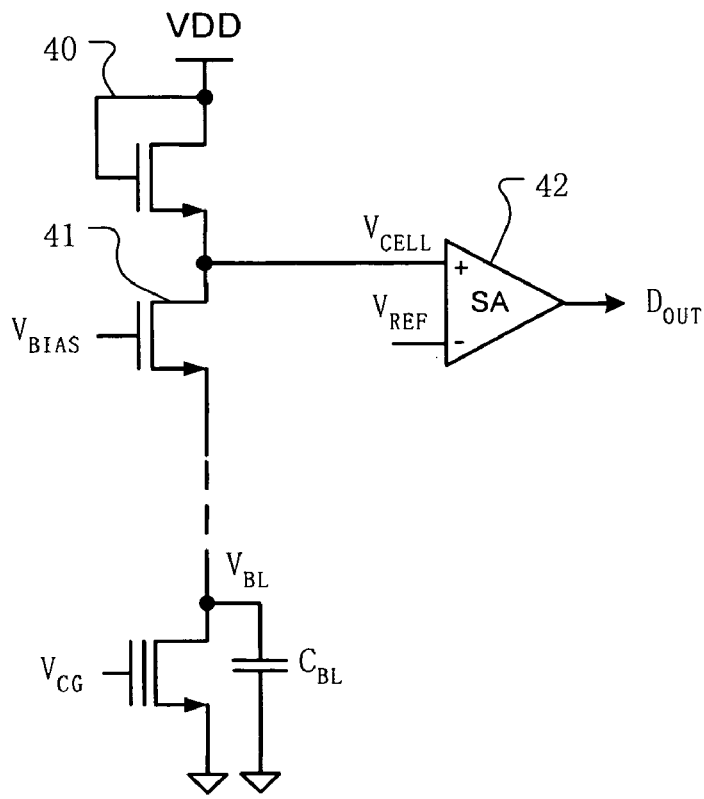
FIG. 2 illustrates a prior art sensing circuit based on static bias voltage clamping.
Figure 3:
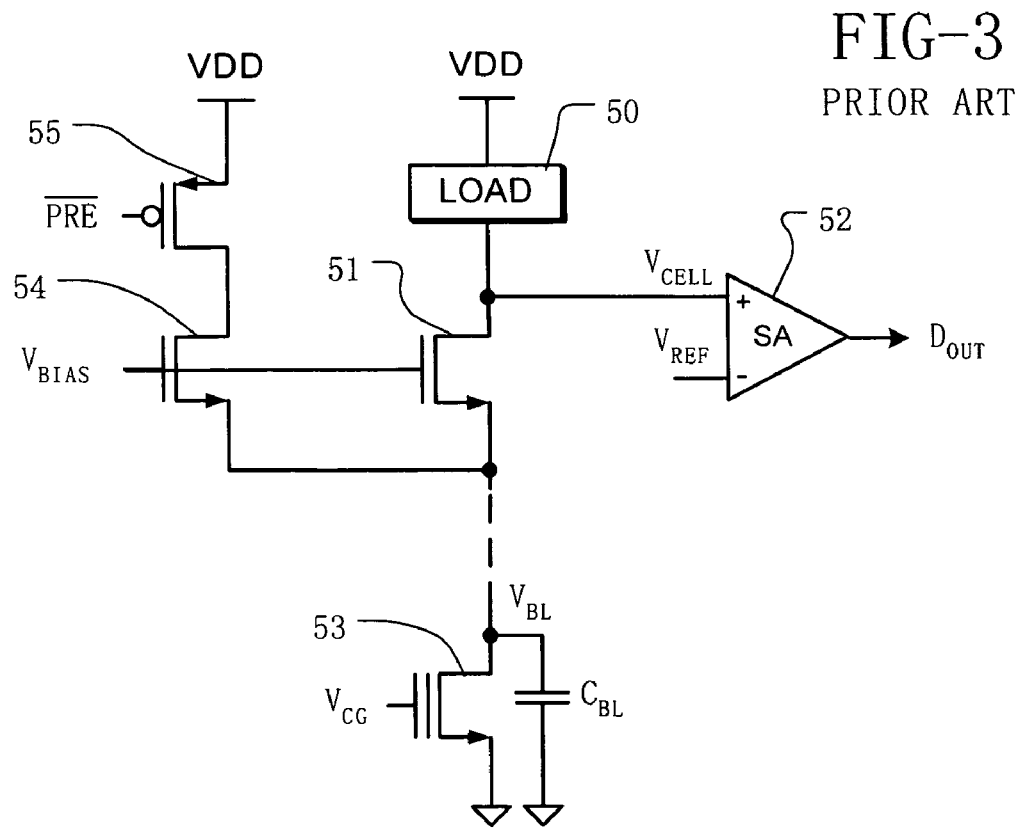
FIG. 3 illustrates a prior art sensing circuit including a fast precharge circuit along with voltage clamping.
Figure 4:
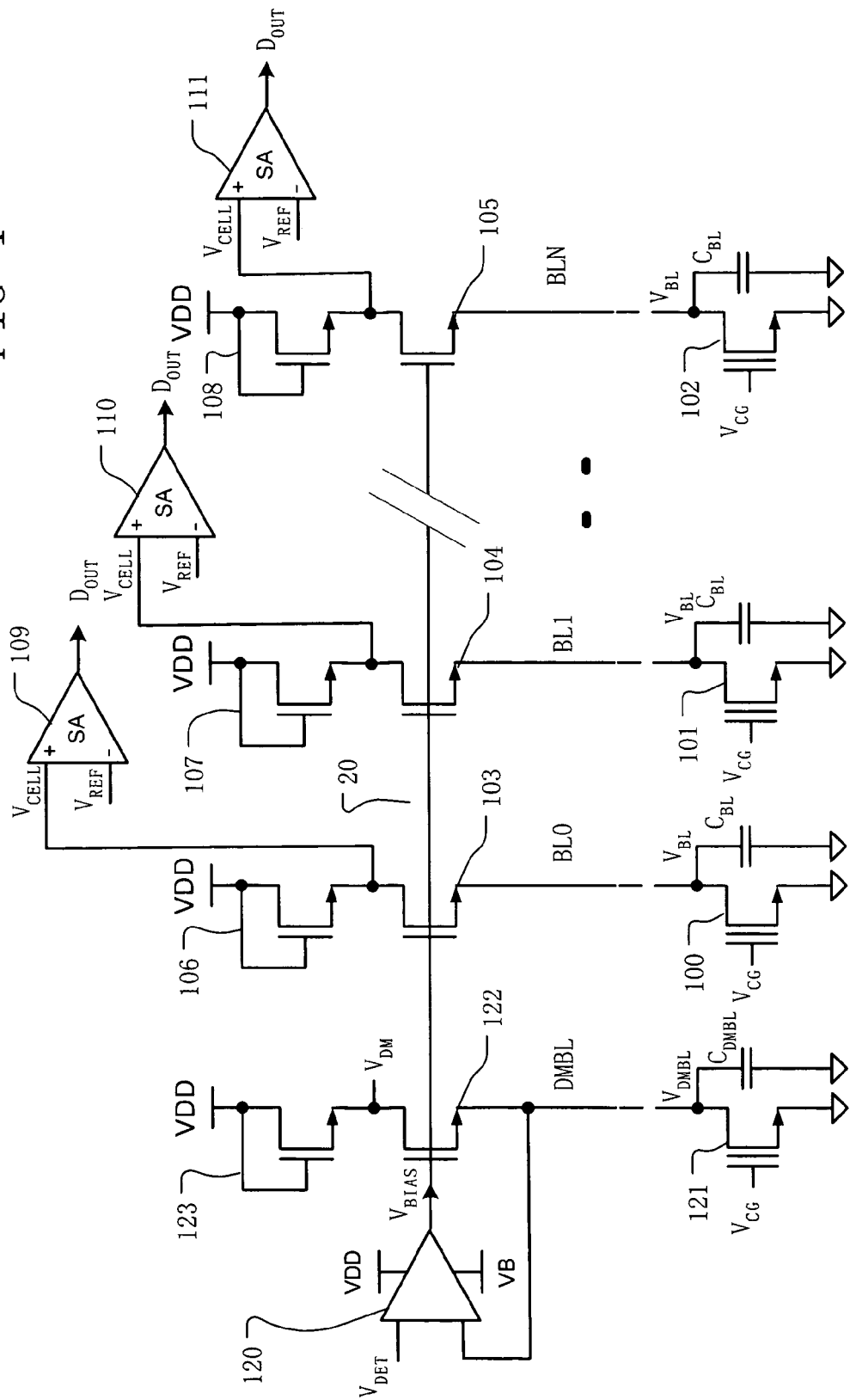
FIG. 4 illustrates a sensing circuit including an extra bit line and shared clamping bias.
Figure 5:
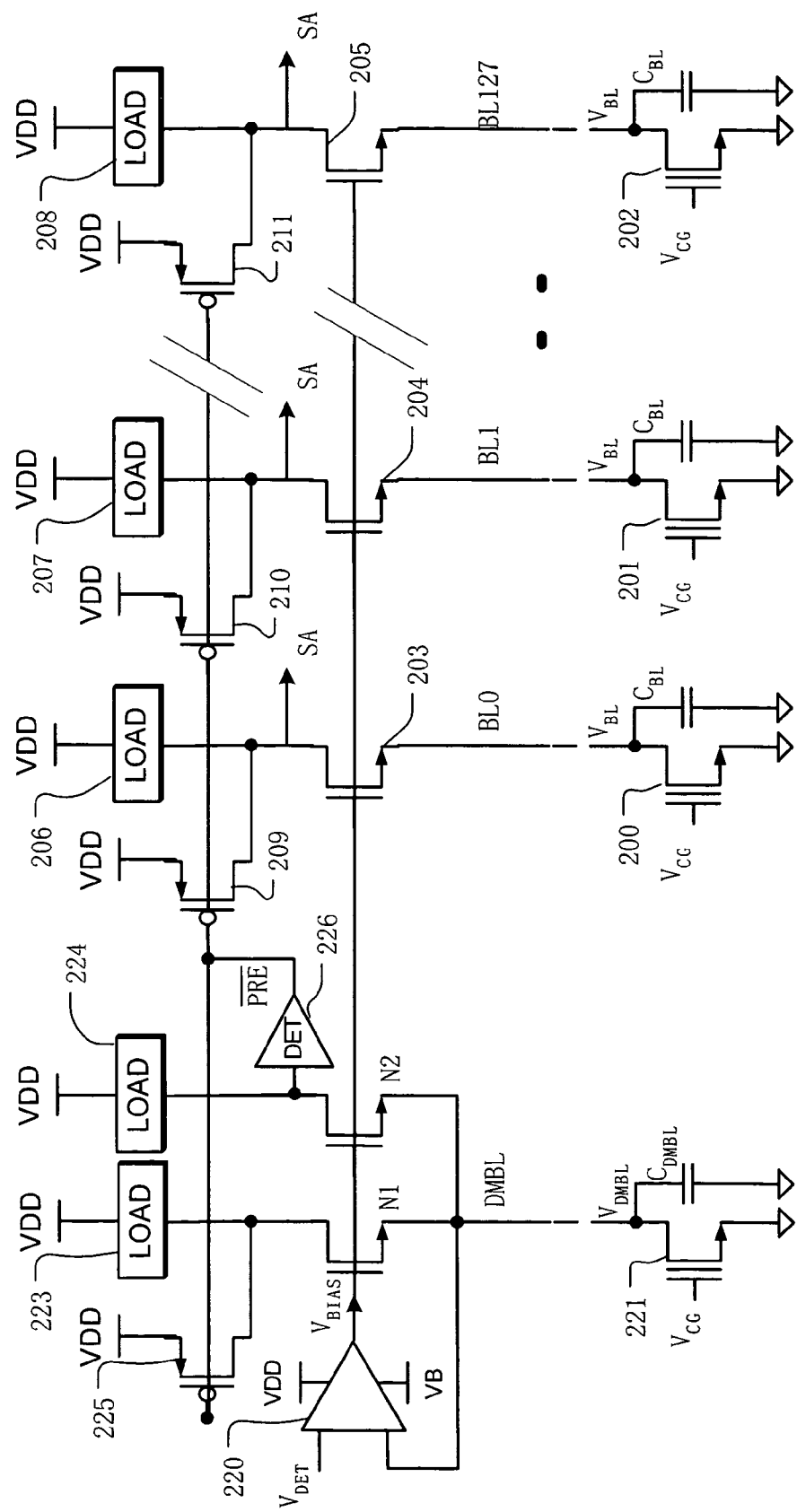
FIG. 5 illustrates a sensing circuit including an extra bit line, shared clamping bias, and fast precharge switching.
Figure 6:
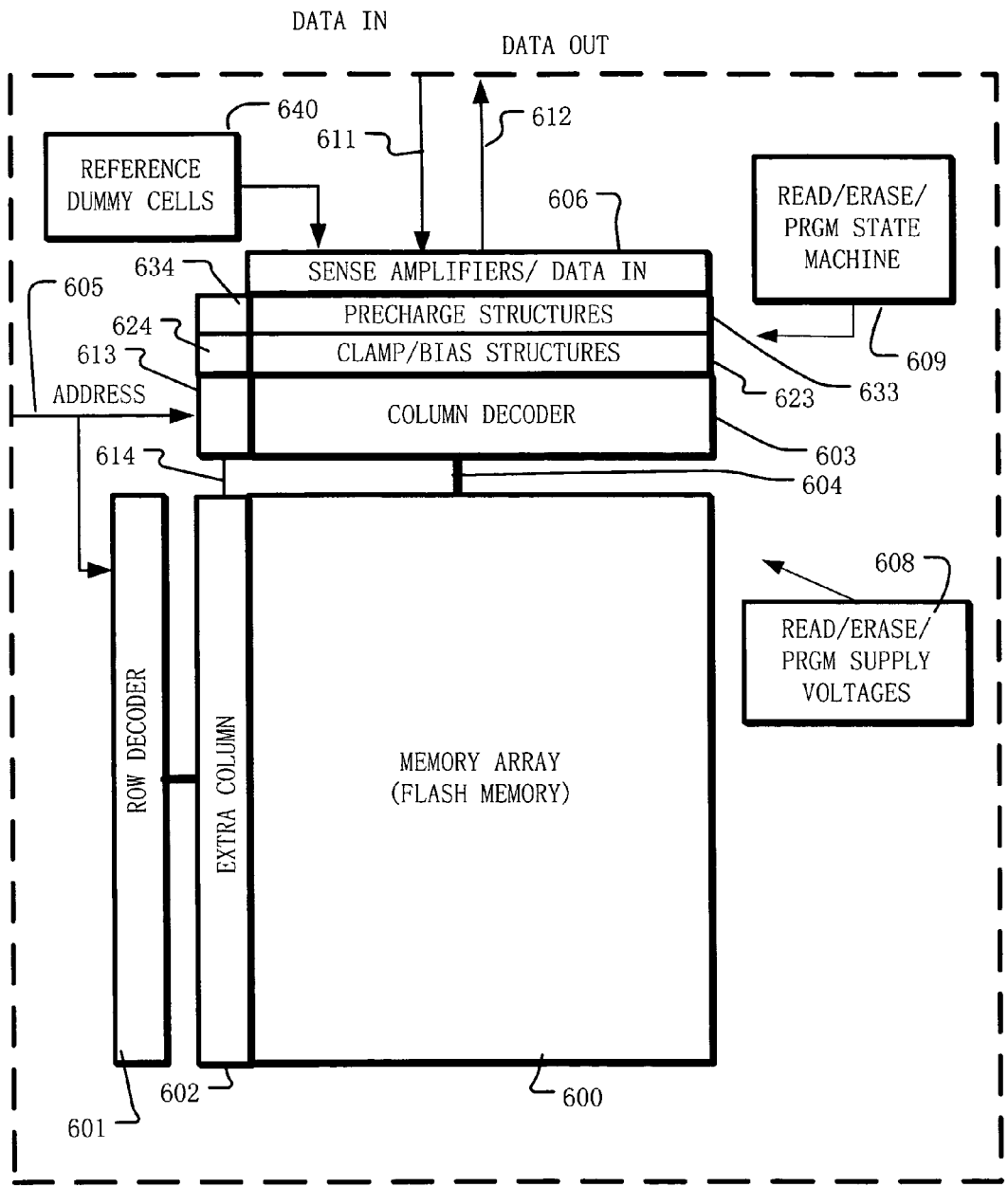
FIG. 6 is a simplified block diagram of an integrated circuit memory device including the technology described herein.

A detailed description of embodiments of the present invention is provided with reference to the FIGS. 4–6.

FIG. 4 illustrates sensing circuitry including a reference bit line DMBL (dummy bit line) and shared biasing circuitry for high speed and low power precharging. A memory array is represented by memory cells 100–102, found on respective columns in an array of memory cells, and selected for connection to bit lines by decoding circuitry not shown. Capacitor symbols $C_{BL}$ are illustrated, and associated with each of the bit lines. The capacitor symbols $C_{BL}$ represent the total bit line capacitance for access to a selected cell. In the illustrated embodiment, there are N bit lines, labeled BL0, BL1, . . . BLN in the array of memory cells. Clamp transistors 103–105 and load transistors 106–108 are included on respective bit lines BL0–BLN, and arranged identically in the illustrated embodiment. Clamp transistor 103 acts as a clamping circuit on bit line BL0. In this embodiment, the clamp transistor 103 is an n-channel MOS transistor with a source coupled to a conductor which is in turn coupled via decoding circuitry to the selected memory cell, with a drain coupled to a sensing node $V_{CELL}$, and a gate coupled to a biasing node $V_{BIAS}$. Load transistor 106 acts as a load on bit line BL0. The load transistor is an n-channel MOS transistor with its drain and gate coupled to the supply potential VDD, and its source coupled to the sensing node $V_{CELL}$. Clamp transistor 104 and load transistor 107 on bit line BL1 are arranged in the same way. Likewise, clamp transistor 105 and load transistor 108 on bit line BLN are arranged in the same way. As illustrated, the clamp transistors 103–105 have their gates coupled to a common node at the output of a comparator 120, which applies the bias voltage $V_{BIAS}$.

The sensing node $V_{CELL}$ on bit line BL0 is coupled to sense amplifier 109. Likewise, the sensing node $V_{CELL}$ on bit line BL1 is coupled to sense amplifier 110. The sensing node $V_{CELL}$ on bit line BLN is coupled to sense amplifier 111. Each of the sense amplifiers 109–111 includes a second input coupled to a reference voltage $V_{REF}$. The sense amplifiers 109–111 provide output data $D_{OUT}$, which indicates the data stored in the respective selected memory cells 100–102.

The reference bit line DMBL is arranged to emulate the timing behavior of the bit lines BL0–BLN in the array. In the embodiment shown, the reference bit line DMBL is coupled to extra column of memory cells by decoding circuitry, not shown, similar to that on the bit lines BL0–BLN in the array. A selected memory cell 121 in the extra column is illustrated in the figure, representing that the structure of the extra column of memory cells coupled to the reference bit line DMBL matches the structure of the columns of memory cells in the array. Likewise, the capacitor symbol $C_{DMBL}$ is shown representing the capacitance of the path to a selected memory cell 121 on the reference bit line DMBL. A clamp transistor 122 and a load transistor 123 are included on the reference bit line DMBL. The clamp transistor 122 is an n-channel MOS transistor with a source coupled to a conductor in the reference bit line, which is in turn coupled via decoding circuitry, or other structures that account for the load on the bit lines in the array contributed by the decoding circuitry in the array, to the selected memory cell 121. The drain of clamp transistor 122 is coupled to a reference sensing node $V_{DM}$, and a gate is coupled to the biasing node $V_{BIAS}$. Load transistor 106 on reference bit line DMBL is an n-channel MOS transistor with its drain and gate coupled to the supply potential VDD, and its source coupled to the reference sensing node $V_{DM}$. The reference sensing node $V_{DM}$ in one embodiment is coupled to a dummy sense amplifier, not shown, or other structure having a load the like that of the load of actual sense amplifiers on the bit lines in the array, so that the behavior of the reference bit line emulates that of the actual bit lines for the purposes of providing the clamping and precharge control as described herein.

Comparator 120 has a first input (negative polarity) coupled to a reference voltage $V_{DET}$ and a second input (positive polarity) coupled to the source of the clamp transistor 122 on the reference bit line. A first supply potential, such as the potential VDD, and a second supply potential VB, which is lower than the first supply potential and close to a target precharge voltage on the bit lines, are applied to the comparator 120. For example, in one embodiment VDD is about three volts, and VB is about 2.3 volts. The output of the comparator 120 is the bias voltage $V_{BIAS}$, and has a level close to the supply potential VDD when the reference bit line voltage is below the reference voltage $V_{DET}$, and has a level near the second supply potential VB, when the voltage on the reference bit line is above the reference voltage $V_{DET}$. In the illustrated embodiment, the voltage $V_{DET}$ is set at a level about VB minus the threshold of the clamp transistor 122. In this manner, as the voltage on the reference bit line approaches VB minus the threshold of the clamp transistor 122, the reference bit line is balanced and the voltage on the sensing node $V_{DM}$ is stabilized. Likewise, the voltage $V_{BIAS}$ is applied to the gates of the clamp transistors 103–105 on all of the bit lines BL0–BLN in the array. Shortly after the comparator 120 switches the voltage $V_{BIAS}$ from the supply potential VDD to the supply potential VB, the precharge cycle in the array is completed, and the bit lines BL0–BLN in the array are ready for sensing. Upon accessing a memory cell, the cell data influences the voltage at the node $V_{CELL}$, causing it to move quickly toward a high cell threshold value $V_{CELL\_HVT}$ or toward a low cell threshold value $V_{CELL\_LVT}$. The reference voltage $V_{REF}$ applied to the sense amplifiers 109, 110, 111 is set at a value about halfway between $V_{CELL\_HVT}$ and $V_{CELL\_LVT}$. The margin between the target value on $V_{CELL}$ and $V_{REF}$ at the sense amplifiers 109, 110, 111 is large enough to cover noise effects, but as small as possible for quick sensing.

FIG. 5 illustrates another embodiment of sensing circuitry including a reference bit line DMBL (dummy bit line) and shared biasing circuitry for high speed and low power precharging. The sensing circuitry of FIG. 5 is suited for higher-speed operation than that of FIG. 4, and for large numbers of bit lines. A memory array is represented by memory cells 200–202 found on respective columns in an array of memory cells. Selected memory cells are selected for connection to bit lines BL0–BL127 by decoding circuitry not shown. Capacitor symbols $C_{BL0}$–$C_{BL127}$ are illustrated, and associated with each of the bit lines. The capacitor symbols $C_{BLx}$ represent the total bit line capacitance for access to a selected cell. In the illustrated embodiment, there are N=128 bit lines, labeled BL0, BL1, . . . BL127 in the array of memory cells. Clamp transistors 203–205 and loads 206–208 are included on respective bit lines BL0–BL127, and arranged identically in the illustrated embodiment. Thus, clamp transistor 203 acts as a clamping circuit on bit line BL0. The claims transistor 203 is an n-channel MOS transistor with a source coupled to a conductor which is in turn coupled via decoding circuitry to the selected memory cell, with a drain coupled to a sensing node SA, and a gate coupled to a biasing node $V_{BIAS}$. The sensing nodes SA are coupled to sense amplifiers according to the particular sensing technology applied, including for example in the manner described above with reference to the other figures. Load 206 on bit line BL0 can be an n-channel MOS transistor as described above, or other load circuits. Clamp transistor 204 and load 207 on bit line BL1 are arranged in the same way. Likewise, clamp transistor 205 and load 208 on bit line BL127 are arranged in the same way. As illustrated, the clamp transistors 203–205 have their gates coupled to a common node at the output of a comparator 220, which applies the bias voltage $V_{BIAS}$.

Precharge transistors 209, 210, 211 are coupled to respective bit lines BL0, BL1, BL127 in the embodiment of FIG. 5. The precharge transistors 209–211 act as precharge circuits on the respective bit lines, and in the illustrated embodiment comprise p-channel MOS transistors having their sources coupled to a precharge supply, such as the supply potential VDD or other suitable precharge supply potential, their drains coupled to the sensing nodes SA, or other suitable nodes, on the respective bit lines BL0–BL127, and their gates coupled to a precharge control signal PRE which is generated at the output of the detector 226. Thus, during assertion of the control signal PRE, which is active low in this embodiment, precharge current is applied to the bit line via the precharge transistors 209–211. Also, the precharge transistors 209–211 operate based on shared control circuitry that is responsive to the reference bit line DMBL.

The reference bit line DMBL is arranged to emulate the timing behavior of the bit lines BL0–BL127 in the array. In the embodiment shown, the reference bit line DMBL is coupled to an extra column of memory cells by decoding circuitry, not shown, similar to that on the bit lines BL0–BL127 in the array. A selected memory cell 221 in the extra column is illustrated in the figure, representing that the structure of the extra column of memory cells coupled to the reference bit line DMBL match the structure of the columns of memory cells in the array. Likewise, the capacitor symbol $C_{DMBL}$ is shown representing the capacitance of the path to a selected memory cell 221 on the reference bit line DMBL. A clamp transistor N1 and a load 223 are included on the reference bit line DMBL. The clamp transistor N1 is an n-channel MOS transistor, substantially matching the clamp transistors 203–205 in the array, with a source coupled to a conductor in the reference bit line, which is in turn coupled via decoding circuitry to the selected memory cell 221, with a drain coupled to a load 223 and a gate coupled to the biasing node $V_{BIAS}$. Load 223 on reference bit line DMBL matches the loads 206–208 in the array. The node at the drain of clamp transistor N1 in one embodiment is coupled to a dummy sense amplifier, not shown, or other structure having a load the like that of the load of an actual sense amplifier on the bit lines in the array, matching as closely as necessary so that the behavior of the reference bit line emulates that of the actual bit lines for the purposes of providing the clamping and precharge control as described herein.

A precharge transistor 225 is included which matches the precharge transistors 209–211 on the bit lines BL0–BL127 in the array. The control signal PRE for the precharge transistors 225, and 209–211 is generated by the detector 226. The detector 226 is coupled to a second clamp transistor N2, which is in turn coupled via a load 224 to the supply potential VDD. Thus the second clamp transistor N2 has a source coupled to the source of the first clamp transistor N1, a gate coupled to the node $V_{BIAS}$, and a drain coupled to the load 224. The drain of the second clamp transistor N2 is coupled to the input of the detector 226, which switches the control signal PRE from the low state to the high state, turning off the precharge transistors 225 and 209–211, when the voltage on the drain of second clamp transistor N2 reaches the detector threshold.

Comparator 220 has a first input (negative polarity) coupled to a reference voltage $V_{DET}$ and a second input (positive polarity) coupled to the source of the clamp transistors N1 and N2 on the reference bit line. A first supply potential, such as the potential VDD, and a second supply potential VB, which is lower than the first supply potential, and close to a target precharge voltage on the bit lines, are applied to the comparator 220. For example, in one embodiment VDD is about three volts, and VB is about 2.3 volts. The output of the comparator 220 is the bias voltage $V_{BIAS}$, and has a level close to the supply potential VDD when the reference bit line voltage is below the reference voltage $V_{DET}$, and has a level close to the second supply potential VB, when the voltage on the reference bit line is above the reference voltage $V_{DET}$. In the illustrated embodiment, the voltage $V_{DET}$ is set at a level which is about VB minus the threshold of the clamp transistor N1. In this manner, as the voltage on the reference bit line approaches VB minus the threshold of the clamp transistor N1, the reference bit line is balanced and the voltage on the sensing node $V_{DM}$ is stabilized. Likewise, the voltage $V_{BIAS}$ is applied to the gates of the clamp transistors 203–205 of all of the bit lines BL0–BL127 in the array. Shortly after the comparator 220 switches the voltage $V_{BIAS}$ from the supply potential VDD to the supply potential VB, the precharge cycle in the array is completed, and the bit lines BL0–BLN in the array are ready for sensing. Upon accessing a memory cell, the cell data influences the voltage at the node SA, causing it to move quickly toward a high cell threshold value $V_{CELL\_HVT}$ or toward a low cell threshold value $V_{CELL\_LVT}$. Sense amplifiers (not shown) are implemented for example, as described above with reference to FIG. 4.

The first clamp transistor N1 and the second clamp transistor N2 are similar devices, except that the second clamp transistor N2 is arranged so that it has a slightly higher threshold voltage than the first clamp transistor N1 in the illustrated embodiment. For example, the second clamp transistor N2 has a longer and narrower channel region than the first clamp transistor N1. In this manner, the second clamp transistor N2 will turn off slightly before the first clamp transistor N1, causing the input to the detector 226 to rise quickly, trigger the detector 226, and thereby turn off the precharge transistors. Thus, the precharge transistors 209–211 are turned off before the dynamic balancing of the clamp transistors 203–205 is finished, to avoid over-charging. A faster precharge operation is achieved because of greater current provided by the precharge transistors parallel with the loads on the bit lines in the array, during the beginning of the precharge cycle.

It is noted that the clamp circuits and precharge circuits in the illustrated embodiments are made with single transistors. Although other embodiments may include additional circuit elements, single transistor embodiments of the clamp circuits and precharge circuits are efficient in power consumption, size and speed.

FIG. 6 is a simplified block diagram of an integrated circuit including precharge and clamping circuitry controlled by a reference bit line. The integrated circuit includes a memory array 600 implemented using memory cells, such as floating gate or charge trapping non-volatile memory cells, read only memory cells, or other types of memory cells. A page/row decoder 601 is coupled to a plurality of word lines arranged along rows in the memory array 600. A column decoder 603 is coupled to a plurality of bit line conductors 604 arranged along columns of memory cells in the memory array 600. Clamping/bias structures 623 are coupled to the columns of memory cells in the memory array via the column decoder 603 and bit line conductors 604 in the manner described above, including for example in the manner described with respect to FIG. 4 or FIG. 5. Also, precharge structures 633 are coupled to the columns of memory cells in the memory array via the column decoder 603 and bit line conductors 604 in the manner described above, including for example in the manner described with respect to FIG. 5. An extra column 602 of memory cells is included in the memory array 600. The extra column can be formed adjacent to the memory array or elsewhere on the integrated circuit in alternative embodiments. A reference bit line conductor 614 is coupled to circuitry 613 including shared control circuitry and matching components for the column decoder circuitry 603 in the array, circuitry 624 including shared control circuitry and matching components, the clamp/bias structures 623 in the array and circuitry 634 including shared control circuitry, and matching components for the precharge structures 633 in the array.

Addresses are supplied on bus 605 to column decoder 603 (and circuitry 613) and page/row decoder 601. Sense amplifiers and data-in structures in block 606 are coupled to the selected memory cells via the column decoder 603, clamp/bias structures 623, and precharge structures 633. A plurality of reference dummy cells 640 is included on the integrated circuit, and used for generating reference voltage which is used by the sense amplifiers in the block 606, so that the reference voltage used by the sense amplifiers in the block 606 track changes in threshold of the actual memory cells in the memory array 600. Data is supplied via the data-in line 611 from input/output ports on the integrated circuit to the data-in structures in block 606. Data is supplied via the data-out line 612 from the sense amplifiers in block 606 to input/output ports on the integrated circuit.

Resources for controlling the reading, programming and erasing of memory cells in the array 600 are included on the chip. These resources include read/erase/program supply voltage sources represented by block 608, and the state machine 609, which are coupled to the array 600, the decoders 601, 603 and other circuitry on the integrated circuit, which participates in operation of the device.

The supply voltage sources (block 608) are implemented in various embodiments using charge pumps, voltage regulators, voltage dividers and the like as known in the art, for supplying various voltage levels, including negative voltages, used in the read, erase and program operations.

The state machine 609 supports read, erase and program operations. The state machine 609 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    an array of memory cells, including a plurality of columns and rows;
    a plurality of bit lines coupled to columns in the array;
    a plurality of word lines coupled to rows in the array;
    an extra column of memory cells and a reference bit line coupled to the extra column of memory cells;
    clamp circuits, coupled to respective bit lines in the plurality of bit lines, and adapted to prevent voltage on the respective bit lines from exceeding a target level;
    precharge circuits, coupled to respective bit lines in the plurality of bit lines; and
    a precharge detector having in input coupled to the reference bit line and an output coupled to the precharge transistors, which generates a precharge signal on its output which turns on the precharge transistors when the reference bit line has a voltage below the target level, and which turns off the precharge transistors when the reference bit line has a voltage near the target level.

2. The device of claim 1, wherein the precharge circuits include a precharge transistor having a gate, a first channel terminal coupled to a supply voltage and a second channel terminal coupled to conductors coupled with corresponding columns of memory cells in the array.

3. The device of claim 1, including:
    a reference clamp circuit on the reference bit line;
    a comparator having an input coupled to the reference bit line, a second input coupled to a reference voltage, and an output coupled to the clamp circuits on the plurality of bit lines, and to the reference clamp circuit, which generates a bias voltage on its output which turns on the clamp circuits with a first bias level when the reference bit line has a voltage below the reference voltage, and with a second bias level lower than the first bias level, when the reference bit line has a voltage near the reference voltage; and
    a circuit causing the precharge detector to generate the precharge signal before the comparator switches from the first bias level to the second bias level.

4. The device of claim 1, wherein the reference bit line is adapted to emulate timing behavior in the bit lines in the plurality of bit lines.

5. The device of claim 1, wherein the array has a number N rows of memory cells and the extra column includes the number N memory cells.

6. The device of claim 1, including a set of sense amplifiers, sense amplifiers in the set including respective first inputs coupled to selected bit lines in the plurality of bit lines, and respective second inputs coupled to reference circuits.

7. The device of claim 1, including a set of sense amplifiers, sense amplifiers in the set including respective first inputs coupled to selected bit lines in the plurality of bit lines, and respective second inputs coupled to reference memory cells, the reference memory cells adapted to emulate behavior of threshold voltages in memory cells in the array.

8. The device of claim 1, including a comparator, having one input coupled to a node on the reference bit line, and another input coupled to a reference voltage, and having an output coupled to said clamp circuits.

9. The device of claim 1, including a reference clamp transistor having a gate, a source coupled to a clamping node on the reference bit line, and a drain coupled to a load circuit on the reference bit line, and a comparator, having one input coupled to the source of the reference clamp transistor, another input coupled to a reference voltage, and an output coupled to the gate of the reference clamp transistor and to said clamp circuits, the comparator producing a bias voltage on its output which turns on the clamp circuits with a first bias level when the reference bit line has a voltage below the target level, and with a second bias level when the reference bit line has a voltage near the reference voltage.

10. The device of claim 9, wherein the second bias voltage is lower than the first bias voltage.

11. The device of claim 9, wherein the second bias voltage is lower than the first bias voltage, and the second bias voltage is a bias level near the target level which maintains the clamp circuits in a clamping condition.

12. The device of claim 1, wherein said array of memory cells comprises non-volatile memory cells.

13. A method for sensing data in a memory device, comprising an array of memory cells, including a plurality of columns and rows, a plurality of bit lines coupled to columns in the array, and a plurality of word lines coupled to rows in the array, the method comprising:
    emulating the timing of bit lines in the plurality of bit lines with an extra column of memory cells and a reference bit line coupled to the extra column of memory cells;
    precharging nodes on respective bit lines in the plurality of bit lines near a target level with precharge circuits responsive to a precharge signal; and
    generating the precharge signal based on timing on the reference bit line.

14. The method of claim 13, including clamping nodes on respective bit lines in the plurality of bit lines by applying a bias voltage to clamping circuits on the plurality of bit lines, the bias voltage having a first bias level when the reference bit line has a voltage below the target level, and having a second bias level when the reference bit line has a voltage near the target level, and wherein the second bias voltage is lower than the first bias voltage.

15. The method of claim 14, including turning off said precharge signal before switching the bias voltage to the second bias level.

16. The method of claim 14, wherein the second bias voltage is a bias level tending to cause the nodes on the respective bit lines to settle near the target level and which maintains the clamp transistor in a clamping condition.

17. The method of claim 13, wherein the array has a number N rows of memory cells and the extra column includes the number N memory cells.

18. The method of claim 13, including sensing voltage or current on selected bit lines in the plurality of bit lines after the precharge signal turns off said precharge transistors.

19. The method of claim 13, including sensing voltage or current on selected bit lines in the plurality of bit lines after the precharge signal turns off said precharge circuits, by comparison with voltage or current through a reference memory cell.

20. The method of claim 13, wherein said array of memory cells comprises non-volatile memory cells.

21. A memory device, comprising:
    an array of memory cells, including a plurality of columns and rows;

a plurality of bit lines coupled to columns in the array, bit lines in the plurality respectively including a load between a supply voltage and a sensing node, and a clamp transistor having a gate, a drain coupled to the sensing node and a source coupled to a conductor coupled to the corresponding columns in the array;

a plurality of word lines coupled to rows in the array;

an extra column of memory cells and a reference bit line coupled to the extra column of memory cells, the reference bit line including a reference clamp transistor having a gate, a drain coupled to the reference node and a source coupled to a conductor coupled to the extra column of memory cells;

a plurality of precharge transistors coupled to respective bit lines in the plurality of bit lines and the reference bit line, a precharge transistor in the plurality of precharge transistors having a gate, a first channel terminal coupled to a precharge supply voltage and a second channel terminal coupled to the reference bit line;

a detector having an input coupled to the reference bit line, and an output coupled to the gates of the precharge transistors on the plurality of precharge transistors, the detector generating a precharge signal on its output which turns off the precharge transistors when the reference bit line has a voltage above a detector voltage, and which turns on the precharge transistors when the reference bit line has a voltage below the detector level;

a comparator having an input coupled to the source of the reference clamp transistor, a second input coupled to a reference voltage, and an output coupled to the gates of the clamp transistors on the plurality of bit lines, and to the gate of the reference clamp transistor, the comparator generating a bias voltage on its output which turns on the clamp transistors with a first bias level when the source of the reference clamp transistor has a voltage below the reference voltage, and with a second bias level when the source of the reference clamp transistor has a voltage near the target level; and a set of sense amplifiers, sense amplifiers in the set including respective first inputs coupled to the sensing nodes on selected bit lines in the plurality of bit lines, and respective second inputs coupled to reference circuits.

22. The device of claim 21, including a parallel clamping transistor, having a source coupled to the source of the reference clamping transistor on the reference bit line, a drain coupled through a load to a load supply voltage, and a gate coupled to the output of the comparator, and wherein the input of the detector is coupled to the drain of the parallel clamping transistor, and wherein the parallel clamping transistor has a threshold higher than said reference clamping transistor.

* * * * *